United States Patent [19]

Satake

[11] Patent Number: 5,002,788

[45] Date of Patent: Mar. 26, 1991

[54] METHOD FOR HUMIDIFYING RICE GRAINS

[75] Inventor: Toshihiko Satake, Higashihiroshima, Japan

[73] Assignee: Satake Engineering Co., Ltd., Tokyo, Japan

[21] Appl. No.: 204,639

[22] Filed: Jun. 9, 1988

[30] Foreign Application Priority Data

Jun. 12, 1987 [JP] Japan ................... 62-147223

[51] Int. Cl.⁵ ............................................. A23B 9/00
[52] U.S. Cl. ................................... 426/507; 426/456; 426/483
[58] Field of Search ............... 426/507, 508, 483, 456

[56] References Cited

U.S. PATENT DOCUMENTS 2,592,407  3/1950  Fernandes .
4,055,673  10/1977  Mueller et al. ................. 426/507
4,338,344  7/1982  Brooks et al. .................. 426/508
4,450,181  5/1984  Satake ............................ 426/507

FOREIGN PATENT DOCUMENTS 0170404  2/1986  European Pat. Off. .
62-204858  9/1987  Japan .
2503383  8/1975  Netherlands .

Primary Examiner—Donald E. Czaja
Assistant Examiner—Mary S. Mims
Attorney, Agent, or Firm—Darby & Darby

[57] ABSTRACT

Provided are a method and an apparatus for humidifying rice grains. Rice grains immediately after polishing and, hence, still maintained at an elevated temperature are supplied with water. The rice grains are further humidified under application of a pressure. This two-staged humidification remarkably shortens the time required for the humidification of rice grains after polishing.

13 Claims, 1 Drawing Sheet

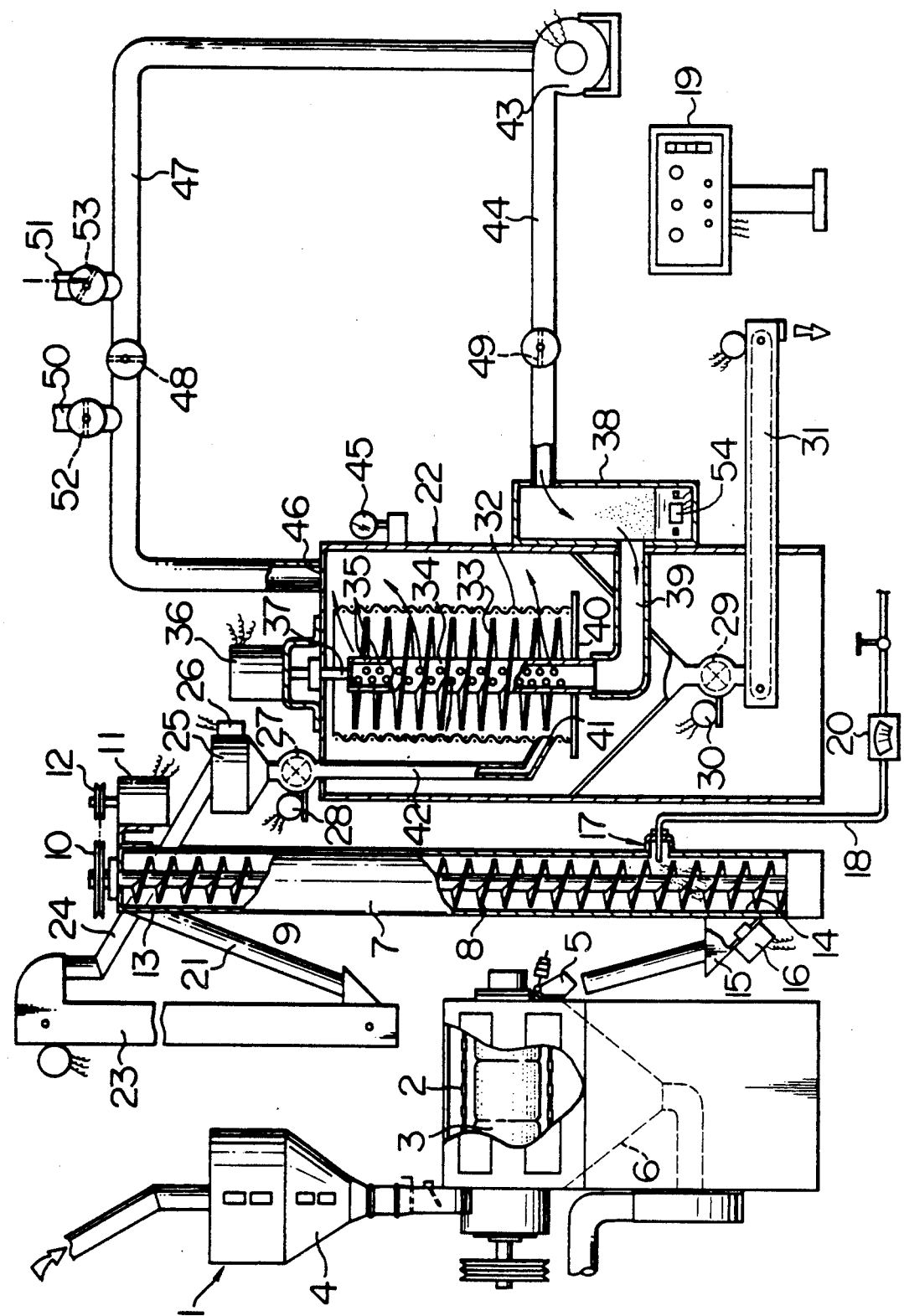

METHOD FOR HUMIDIFYING RICE GRAINS

BACKGROUND OF THE INVENTION

The present invention relates to a method of and an apparatus for humidifying rice grains, particularly rice grains after polishing.

It is well known that rice grains are polished in a rice polishing machine which has a polishing cylinder having a perforated cylindrical wall and a polishing rotor. During the polishing, water contents are carried away from the rice grains due to generation of heat, with the result that the taste is impaired. Therefore, it has been a common practice to humidify the polished rice grains to a moderate level of moisture content. The humidification is practically conducted by placing the polished rice grains in a tank which is provided with a moistening device which can moisten polished rice grains at such a low rate that would not cause cracking of the rice grains due to quick absorption of water, e.g., about 0.2% per hour, taking a long time of 5 to 10 hours. The humidification of the polished rice grains is therefore an essential process which has to be effected on the polished rice grains, partly because of the drying of rice grains during the polishing and partly because of the tendency that the farmers furnish the reaped rice grains in an excessively dry condition to rice processing firms. The current/rice milling factories usually have a series of treating apparatus arranged in a line to attain a large treating capacity and a high treating efficiency. Unfortunately, however, the humidification process which requires 5 to 10 hours as described undesirably poses an impediment to the efficient uniform treatment work of the rice grains.

OBJECT AND SUMMARY OF THE INVENTION

Accordingly, an object of the present invention is to provide a method of and an apparatus for humidifying polished rice grains which enables the polished rice grains to be humidified to a moderate level of water content (about 15%) by adding a large amount of water to the polished rice grains in a period as short as possible.

According to one aspect of the present invention, there is provided a method of humidifying polished rice grains comprising the steps of adding water to the rice grains immediately after the polishing, and humidifying the rice grains under application of pressure of a suitable level.

According to another aspect of the present invention, there is provided an apparatus for carrying out the method of the first aspect, comprising a substantially upright conveyor case accommodating a screw conveyor and disposed immediately downstream from the polishing machine, a water adding section provided in a lower portion of the conveyor case, a hermetic pressurizing tank having an inlet portion and an outlet portion which are provided with air shut-off valves, and a pressurizing means, moistened air generating means and stirring means which are associated with the pressurizing tank, the inlet portion of the pressurizing tank being connected to the discharge portion of the conveyor case.

In rice grain which has been heated during, for example, polishing, the water component has been moved to the surface region of the grain. In such a case, even if water is added in an amount which is greater than such an amount that water can be usually added without incurring cracking of rice grain, the moisture content in the surface region of the rice grain and the moisture content in inner region of the rice grain are well balanced, so that the rice grain can be humidified without any substantial cracking.

The present invention makes use of this phenomenon. Thus, according to the invention, water is added directly to the rice grains which have been heated through, for example, polishing, followed by humidification under pressure while the temperature of the rice grains are still maintained, whereby the rice grains are adequately humidified in a short time without the risk of cracking.

BRIEF DESCRIPTION OF THE DRAWINGS

The attached sole FIGURE is front elevational view of the whole portion of an embodiment of the present invention.

DESCRIPTION OF THE PREFERRED EMBODIMENT

A preferred embodiment of the present invention will be described hereinunder with reference to the attached drawing.

A rice grain polishing machine 1 has a polishing cylinder 2 having a perforated wall and a polishing rotor 3 which is laid in the polishing cylinder 2 horizontally and rotatably and which is made of emery. The polishing machine 11 further has a supply hopper 4, a discharge trough 5 and a bran collecting hopper 6. A substantially upright conveyor case 7 is disposed in the vicinity of the polishing machine 1 and a screw conveyor 8 is rotatably disposed in the conveyor case 7. The screw conveyor 8 has a conveyor shaft which projects above the conveyor case 7 and a pulley 10 is fixed to the projecting end of the conveyor shaft. This pulley 10 is drivingly connected through a V belt to a pulley 12 on an electric motor 11 which is mounted on the top of the conveyor case 7. The conveyor case 7 has an inlet 14 provided at the lower end thereof and an outlet 13 provided at the upper end thereof. A supply hopper 15 having a temperature sensor 16 is connected to the inlet 14. The temperature sensor 16 is capable of sensing the temperature of the rice grains which are to be supplied into the conveyor case 7.

A water adding section 17 is provided at a lower portion of the conveyor case 7. The water adding section 17 is constituted by a water pipe 18 disposed therein with a solenoid valve 20 and having one end connected to a suitable water source such as a water tank and the other end opened to a lower portion of the interior of the conveyor case 7. The end of the water pipe opening into the conveyor case 7 may be provided with a suitable spray outlet capable of spraying water in the form of a shower or may be equipped with a device capable of supplying the water in the form of fine mist. Provided that the rate of supply of the rice grains from the polishing machine 1 and the water content of such rice grains are constant, since the amount of water to be added varies according to the temperature of the rice grains, when the rice grains have undergone a comparatively small temperature rise during polishing, it is necessary to reduce the rate of supply of the water in order to avoid cracking. The rate of supply of the water is therefore automatically controlled by a control unit (CPU) in a control panel 19, which is electrically connected to the solenoid valve 20 and the temperature sensor 16.

The conveyor case 7 is provided at its outlet 13 with a chute pipe 21 through which the rice grains from the outlet 13 are directly supplied to supply hopper 25 for a pressurizing tank 22 through a bucket elevator 23 and a chute pipe 24.

A description will be given hereinunder as to the construction of the pressurizing tank 22. A supply hopper 25 having a temperature sensor 26 connected to the CPU on the control panel 19 is disposed slightly above the pressurizing tank 22. A supplying rotary valve 27 serving as an air shut-off valve is disposed on a lower portion of the supply hopper 25. An electric motor 28 for driving the rotary valve 27 also is provided on a lower portion of the supply hopper 25. The lower end portion of the pressurizing tank has a funnel-like form and a discharging rotary valve 29 serving also as an air shut-off valve is provided on the lower end extremity of the pressurizing tank 22. An electric motor 30 for driving the rotary valve 29 also is provided on the lower portion of the pressurizing tank 22. A horizontal conveyor means such as a flow conveyor 31 is disposed under the rotary valve 29.

The pressurizing tank 22 receives a conveyor case 32 having a perforated wall and extending substantially upright. The conveyor case 32 rotatably houses a screw conveyor 33 as a stirring means. The screw conveyor 33 has a shaft 34 which is hollow and which is provided with a multiplicity of holes 35 in the peripheral wall thereof. The hollow shaft 34 of the screw conveyor 33 is closed at its top end and is suspended rotatably from a rotary shaft 37 directly coupled to the shaft of an electric motor 36. The lower end of the conveyor shaft 34 is opened and is connected to a discharge pipe 39 of a moistened air generator 38 which is provided on a side wall of the pressurizing tank 22. The connection between the open lower end of the conveyor shaft 34 and the discharge pipe 39 is accomplished in such a manner that a relative rotational and slidable motion is afforded therebetween. A bottom plate 40 rotatably penetrated by the conveyor shaft 34 is provided on the lower end of the conveyor case 32. An inlet opening 41 provided in the wall of the conveyor case 32 at a lower end portion thereof is connected to a supply conduit 42 through the supplying rotary valve 27.

The side wall of the pressurizing tank 22 is provided with a supersonic vibration element 54.

The apparatus further has a booster fan 43 as a pressurizing device and the moistened air generator 38 connected to the booster fan 43 through an air supplying duct 44 disposed therein with a damper 49. A pressure gauge 45 attached to the pressurizing tank 22 is capable of measuring and displaying the pressure in the tank 22.

An air outlet 46 provided in an upper portion of the pressurizing tank 22 is connected to the suction side of the booster fan 43 through an air discharge duct 47. The air discharge duct 47 is disposed therein with a damper 48. Branch pipes 50 and 51 shunt from the air supplying duct 47 at both sides of the damper 48, and are disposed therein with dampers 52, 53 respectively. Each damper is adapted to be activated by an electric motor (not shown) with a servo mechanism. Each electric motor is electrically connected to the controller in the control panel.

The operation of this embodiment is as follows.

Unpolished rice grains supplied into the hopper 4 of the polishing machine 1 are made to flow through the gap between the polishing cylinder 2 and the polishing rotor 3 so that bran portions of the rice grains are removed whereby the rice grains are polished. The polished rice grains are discharged from the outlet 5 and are fed to the supply hopper 15 on the lower portion of the conveyor case 7. The temperature of the polished rice grains is measured by the temperature sensor 16. The measured temperature of the polished rice grains is converted into a digital signal through an A/D converter and is delivered to the controller in the control panel 19. The polished rice grains supplied into the conveyor case 7 through the inlet 14 are conveyed upward by the screw conveyor 8. The water adding section 17 provided at a lower portion of the conveyor case 7 adds water to the polished rice grains which are conveyed upward by the screw conveyor 7.

More specifically, water in a water source such as a water tank is supplied through the water pipe 18 so as to be directly sprayed onto the polished rice grains. The rate of supply of the water is maintained at a constant level by the solenoid valve 20 controlled by the controller in the control panel 19, in such a manner as to cause a predetermined increment of the water content in the rice grains, e.g., 0.5%.

The rate of supply of the water is controlled in accordance with the result of measurement of the temperature by the temperature sensor 16. Namely, when the temperature of the rice grains is lower than a predetermined range, the rate of supply of water is reduced so as to avoid cracking of the rice grains. The polished rice grains thus supplied with water are further conveyed upward by the screw conveyor 8 while being fluidized and stirred by the screw conveyor 8. During the upward convey, the polished rice grains are uniformly wetted and are pressurized by the weights of the rice grains, whereby so-called humidifying polishing is effected. In addition, since the fluidization and stirring are consecutively effected, the temperature of the polished rice grains does not fall so rapidly, and the rice grain temperature exhibited at the outlet of the polishing machine is maintained without substantial drop. In consequence, cracking of the rice grains attributable to quick penetration of water into the grains is avoided. The arrangement may be such that at least part of the wall of the conveyor case 7 is provided with a multiplicity of holes so as to enable removal of the bran.

The polished rice grains which have reached the upper end of the conveyor case 7 are discharged from the outlet 13 and are put into the supplying hopper 25 directly or via a bucket elevator 23 and the chute pipe 24. The temperature of the polished rice grains in the hopper 25 is measured by the temperature sensor 26 and the measured value is inputted to the controller in the control panel 19. Meanwhile, the polished rice grains are allowed to flow into the supplying conduit 42 as a result of rotation of the supplying rotary valve 27 so as to be supplied into the conveyor case 32 past the inlet opening 41.

Meanwhile, the booster fan 43 introduces the air via the branch pipe 51 if the damper 53 is opened to a suitable degree. The air is then made to flow through the moistened air generator 38 in which a mist of water, i.e., ultra-fine particles of the water, is generated in the air so as to moisten the air. The moistened air is then discharged to the pressurizing tank 22 through the discharge pipe 39 and through the interior of the conveyor shaft 34, past the holes 35 formed in the wall of the conveyor shaft 34. Incidentally in this state, the dampers 52 and 48 are closed. Accordingly, an elevated pressure is maintained in the pressurizing tank 22. When a predetermined elevated pressure has been established in the pressurizing tank 22, the damper 48 is opened to a suitable degree so that an air circulation passage is formed through the air discharging duct 47 and the air supplying duct 44 so as to maintain a constant elevated pressure in the pressurizing tank, whereby the moistened air is continuously supplied into the pressurizing tank 22.

The polished rice grains which are being conveyed upward by the screw conveyor 33 in the conveyor case are polished due to friction between the grains caused by the fluidizing and stirring effect produced by the screw conveyor 33. In addition, the penetration of water supplied by the water adding section 17 into the inner side of each rice grain is promoted and the newly supplied ultra-fine particles of the water are caused to uniformly penetrate into the rice grains which are being fluidized and stirred.

Since the polished rice grains are being fluidized and stirred by the screw conveyor 33, the elevated temperature of the polished rice grains is maintained so that the risk for the rice grains to be cracked is eliminated. The amount of water supplied to the polished rice grains in the pressurizing tank 22 is determined such that about 0.5% increment of water content of the rice grains is caused by the addition of the water. The arrangement, however, may be such that the amount or rate of addition of water into the pressurizing tank is controlled in accordance with the result of detection of the water content of the rice grains detected by a water content sensor which may be provided in addition to the temperature sensor 26.

Practically, the increment of the water content is so adjusted that the water content of the rice grains is finally increased to about 15%.

The polished rice grains thus humidified and polished, now exhibiting luster, overflow the upper end of the conveyor case 32 and fall onto the flow conveyor 31 through the discharge rotary valve 29, and are sent to a subsequent treating process.

Although the described embodiment is connected to only one rice polishing machine 1, this, however, is not exclusive and the apparatus of the present invention may be combined with a system composed of two or more rice polishing machine coupled together in series. The type of the rice-polishing machine also has no limitation, and various types of rice polishing machines such as of grinding type, friction type, horizontal shaft type and vertical shaft type can be used successfully in combination with the apparatus of the present invention. Furthermore, the invention can be applied to humidification of rice grains which have been stored after polishing by a polishing machine. In such an application, however, it is necessary to use an additional heating device for heating the rice grains.

As will be fully understood from the foregoing description, the present invention offers various advantages as follows.

According to the invention, the rice grains which have been heated through, for example, a polishing process are first supplied with water. The thus wetted rice grains are conveyed by the vertical screw conveyor while being fluidized and stirred by the same. During the conveyor, water is further applied uniformly to the surfaces of the rice grains. Since this process if executed while the rice grains are still at an elevated temperature, the humidification can be effected in a manner which remarkably suppresses the tendency of cracking of the rice grains as compared with the conventional method.

The rice grains which have been humidified to a certain degree are introduced into the pressurizing tank and polishing is effected by the stirring device while maintaining the temperature of the rice grains, thus accomplishing pressurizing humidification, whereby the humidification of the rice grains to the desired degree of humidity is completed with a speed which is about 10 to 20 times as high as that in the conventional method.

If the remarkable effect produced by the invention has to be attained solely with the use of a pressurizing tank, an impractically large pressurizing tank would be required. On the other hand, the use of the screw conveyor with water adding section alone cannot produce the remarkable effect of the invention because in such a case the fluidizing and stirring time is too short. The remarkable effect of the present invention is obtainable when the vertical screw conveyor with a water adding section and a pressurizing tank with stirring device and moistened air generating device are used in combination in a compact manner as described.

What is claimed is:

1. A method of humidifying dry rice grains comprising the steps:
   (a) providing pre-heated dry rice grains;
   (b) wetting the surface of said pre-heated rice grains with water;
   (c) elevating the ambient air pressure on said wetted rice grains without substantially affecting the temperature of said rice grains;
   (d) introducing a water mist into said pressurized ambient air to further humidify said wetted rice grains.

2. A method of humidifying dry rice grains as in claim 1, wherein said dry rice grains are pre-heated by a preceding rice polishing process.

3. A method of humidifying dry rice grains as in claim 1, wherein said surface wetting is accomplished by spraying water on said dry rice grains.

4. A method of humidifying dry rice grains as in claim 1, wherein the temperature of said rice grains is maintained near the temperature produced by pre-heating said rice, said temperature being substantially maintained throughout steps (a)-(d).

5. A method of humidifying dry rice grains as in claim 1, wherein said rice is humidified to less than 20% moisture by content.

6. A method of humidifying dry rice grains as in claim 1, wherein the quantity of water used for said surface wetting of said pre-heated rice varies inversely to the temperature of said pre-heated rice.

7. A method of humidifying dry rice grains as in claim 3, wherein said surface wetting is effected in a first vertical conveyer carrying said pre-heated rice upward, said water for surface wetting being sprayed in the lower half of said vertical conveyer.

8. A method of humidifying dry rice grains as in claim 1, wherein said wetted rice is exposed to said water mist on a second vertical conveyer carrying said rice upward, said mist being forced to flow through a layer of said wetted rice.

9. A method of humidifying dry rice grains as in claim 8, wherein said second vertical conveyer is within a pressurized chamber.

10. A method of humidifying dry rice grains as in claim 9, wherein said mist includes the fine water droplets and air in mixture, said pressure chamber being pressurized by said air/water mixture.

11. A method of humidifying dry rice grains, comprising the steps:
   polishing said rice grains;
   adding water in the form of a fine mist to said rice grains, said rice grains being maintained substantially at the temperature produced by said polishing;
   exposing said rice grains to a humid, pressurized atmosphere without substantially affecting the temperature of said rice grains.

12. A method of humidifying dry rice grains as in claim 11, wherein said humid atmosphere is a mist comprising fine water droplets and air in mixture.

13. A method of humidifying dry rice grains, comprising the steps:
   placing said dry rice grains in an atmosphere of pressurized air:
   forcing a mixture of water droplets and air through a layer of said rice in said pressurized atmosphere without substantially affecting the temperature of said rice grains.

* * * * *